(12) United States Patent
Inoguchi et al.

(10) Patent No.: US 11,101,197 B2
(45) Date of Patent: Aug. 24, 2021

(54) LEADFRAME SYSTEMS AND RELATED METHODS

(71) Applicant: SEMICONDUCTOR COMPONENTS INDUSTRIES, LLC, Phoenix, AZ (US)

(72) Inventors: Hiroshi Inoguchi, Tatebayashi (JP); Isao Ochiai, Ota (JP); Takayuki Taguchi, Hanyu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 94 days.

(21) Appl. No.: 16/504,929

(22) Filed: Jul. 8, 2019

(65) Prior Publication Data

US 2020/0312748 A1 Oct. 1, 2020

Related U.S. Application Data

(60) Provisional application No. 62/823,773, filed on Mar. 26, 2019.

(51) Int. Cl.
*H01L 23/495* (2006.01)
*H01L 21/56* (2006.01)
*H01L 23/31* (2006.01)
*H01L 21/48* (2006.01)

(52) U.S. Cl.
CPC .... *H01L 23/49513* (2013.01); *H01L 21/4821* (2013.01); *H01L 21/565* (2013.01); *H01L 23/3107* (2013.01); *H01L 23/49568* (2013.01)

(58) Field of Classification Search
CPC ............ H01L 23/49513; H01L 21/565; H01L 23/49568; H01L 23/3107; H01L 21/4821; H01L 23/49582; H01L 23/49503; H01L 23/4334; H01L 23/49541
See application file for complete search history.

(56) References Cited

U.S. PATENT DOCUMENTS

| | | | |
|---|---|---|---|
| 9,237,662 B2 | 1/2016 | Satake | |
| 2005/0221585 A1 | 10/2005 | Perregaux et al. | |
| 2009/0166826 A1* | 7/2009 | Janducayan | H01L 24/32 257/676 |
| 2014/0252574 A1 | 9/2014 | Nakabayashi et al. | |

FOREIGN PATENT DOCUMENTS

| | | |
|---|---|---|
| WO | 2012043313 A1 | 2/2014 |
| WO | 2014136824 | 2/2017 |

* cited by examiner

*Primary Examiner* — Karen Kusumakar
*Assistant Examiner* — Adam S Bowen
(74) *Attorney, Agent, or Firm* — Adam R. Stephenson, Ltd.

(57) ABSTRACT

Leadframe systems and related methods. Specific implementations of leadframe systems may include a die pad, a semiconductor die coupled to the die pad, where the semiconductor die has a perimeter. A leadframe may be coupled over the die pad and the semiconductor die where the leadframe has a solder dam coupled around the semiconductor die and, the solder dam has a perimeter that corresponds with the semiconductor die The die pad may have no groove adjacent to the semiconductor die.

20 Claims, 5 Drawing Sheets

LEADFRAME SYSTEMS AND RELATED METHODS

CROSS REFERENCE TO RELATED APPLICATIONS

This application claims the benefit of the filing date of U.S. Provisional Patent Application 62/823,773, entitled "LEADFRAME SYSTEMS AND RELATED METHODS" to Inoguchi et al., which was filed on Mar. 26, 2019, the disclosure of which is hereby incorporated entirely herein by reference.

BACKGROUND

1. Technical Field

Aspects of this document relate generally to semiconductor packages and methods of making the same.

2. Background

Leadframes are used to make electrical connections between a silicon die of a semiconductor package and an electrical circuit board. Various leadframes include leads that are mechanical structures that extend through a mold material or other packaging material/structure enclosing the semiconductor chip that connect electrical pads or connectors on the semiconductor die with corresponding electrical pads or connectors on the electrical circuit board. For various package types, the leadframe supports the semiconductor die during wire bonding and during molding of a package/mold compound around the die.

SUMMARY

Implementations of semiconductor packages may include: a die pad; a semiconductor die coupled to the die pad, the semiconductor die having a perimeter; and a leadframe coupled over the die pad and the semiconductor die, the leadframe having a solder dam coupled around the semiconductor die, the solder dam having a perimeter that corresponds with the semiconductor die; wherein the die pad has no groove adjacent to the semiconductor die.

Implementations of semiconductor packages may include one, all, or any of the following:

The perimeter of the solder dam may be a predetermined distance greater than the perimeter of the semiconductor die.

Solder may be configured to be deposited into the solder dam without a spanker.

The solder may be flux-contained.

The die pad may be plated with a metal.

The die pad, the semiconductor die, and the leadframe may be encapsulated in an encapsulant.

Implementations of a method of making a semiconductor package may include:

Providing a die pad and coupling a leadframe over the die pad, the leadframe having a solder dam having a perimeter.

The method may further include depositing solder into the solder dam, and bonding a semiconductor die to the solder within the perimeter of the solder dam.

The method may further include retaining the solder under the semiconductor die using the solder dam, where no spanker is used after depositing solder into the solder dam.

Implementations of a method of making a semiconductor package may include one, all, or any of the following:

The die pad may have no groove adjacent to the semiconductor die.

The method may further include preventing tilt of the semiconductor die through retaining the solder using the solder dam.

The perimeter of the solder dam may be a predetermined distance greater than a perimeter of the semiconductor die.

The method may further include preventing a flow of solder using an opening within the solder dam, the opening having a perimeter a predetermined distance greater than the semiconductor die.

The method may further include encapsulating the die pad, the semiconductor die, and the leadframe in an encapsulant.

The method may further include plating the die pad with a metal.

Implementations of a method of providing a heatsink for a semiconductor package may include: providing a leadframe having a solder dam opening therethrough, the leadframe having a first thickness; and bonding a first heatsink with the leadframe. The first heatsink may have a second thickness that is the same as the first thickness where a volume of the leadframe and the first heatsink is the same as a volume of a leadframe without a solder dam opening therethrough and a second heatsink.

Implementations of a method of providing a heatsink for a semiconductor package may include one, all, or any of the following.

The solder dam opening may have a perimeter a predetermined distance greater than a perimeter of a semiconductor die, where the solder dam opening prevents a flow of solder.

No spanker may be used after depositing solder into the solder dam opening.

A combined thickness of the leadframe and the first heatsink may be two-thirds of a combined thickness of the leadframe without the solder dam opening and the first heatsink.

The method may further include bonding a semiconductor die to solder within the perimeter of the solder dam opening.

The method may further include encapsulating at least the leadframe in an encapsulant.

The method may further include preventing tilt of a semiconductor die through retaining the solder with the solder dam opening.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended leadframe systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such high heat stacked leadframes, and implementing components and methods, consistent with the intended operation and methods.

Figure 1:
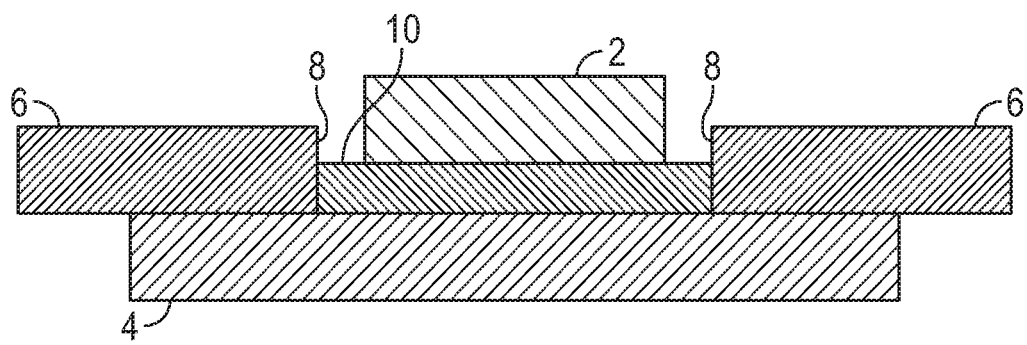
FIG. 1 illustrates an cross sectional view of implementation of a leadframe stacked on an implementation of a die pad taken along sectional line A in FIG. 2.

Referring to FIG. 1, an implementation of a leadframe stacked on/coupled over an implementation of a die pad 4 is illustrated. As illustrated, a semiconductor die 2 is coupled to a die pad 4. In various implementations, by non-limiting example, the die pad 4 may be plated with a metal, such as, by non-limiting example, silver, tin, nickel, copper, or any other desired electrically conductive material. In various implementations, the semiconductor die 2 has a perimeter, which for many die is rectangular. As illustrated, a leadframe 6 is stacked on top of, or coupled over, the die pad 4 and the semiconductor die 2. By inspection, the leadframe 6 forms, or has, a solder dam 8 that surrounds, or couples around the semiconductor die 2. In various implementations, as illustrated, the solder dam 8 has a perimeter that corresponds with the semiconductor die 2. As illustrated, and in various implementations, by non-limiting example, the perimeter of the solder dam 8 is a predetermined or predefined distance larger than the perimeter of the semiconductor die 2. By non-limiting example, this predetermined distance can be any value or range of values, including zero.

In FIG. 1, the die 2 is illustrated after having been bonded to the die pad 4 through solder 10. As will be discussed in this document, solder 10 is dispensed or deposited into the solder dam 8, and, because the solder dam 8 acts to contain the flow of the liquid solder 10 before the solder 10 solidifies, the dam 8 retains the solder within the opening that contains the die therein. In various implementations, by non-limiting example, no spanker is used after the depositing of the solder 10 to attempt to evenly spread the solder across the pad 4, as the surface tension of the solder acts in combination with the solder dam 8 to work to evenly spread the solder across the pad surface prior to application of the die onto the solder. In various implementations, by non-limiting example, the solder 10 may be flux-contained as well by application of flux into the opening formed by the solder dam 8.

As illustrated, the die pad 4 includes no groove(s) adjacent to the semiconductor die 2 for use in attempting to stop or contain the flow of the solder across the pad prior to or after application of the die. In various implementations, by non-limiting example, the solder dam 8 created by the placement of the die pad 4 and the leadframe 6 may allow heat from the semiconductor die 2, or other components, to escape in multiple directions via conduction, thus further facilitating heat dissipation, and it may also allow the solder 10 to substantially or partially retain its thickness. Also, because of the action of the surface tension of the solder with the solder dam, the thickness of the solder may be more substantially uniform across the die pad and under the die through use of the solder dam. In various implementations, by non-limiting example, the package, or the semiconductor die 2, die pad 4, and leadframe 6, may be encapsulated in an encapsulant. In various implementations, by non-limiting example, the encapsulant may be a resin, epoxy, or other molding compound.

Figure 2:
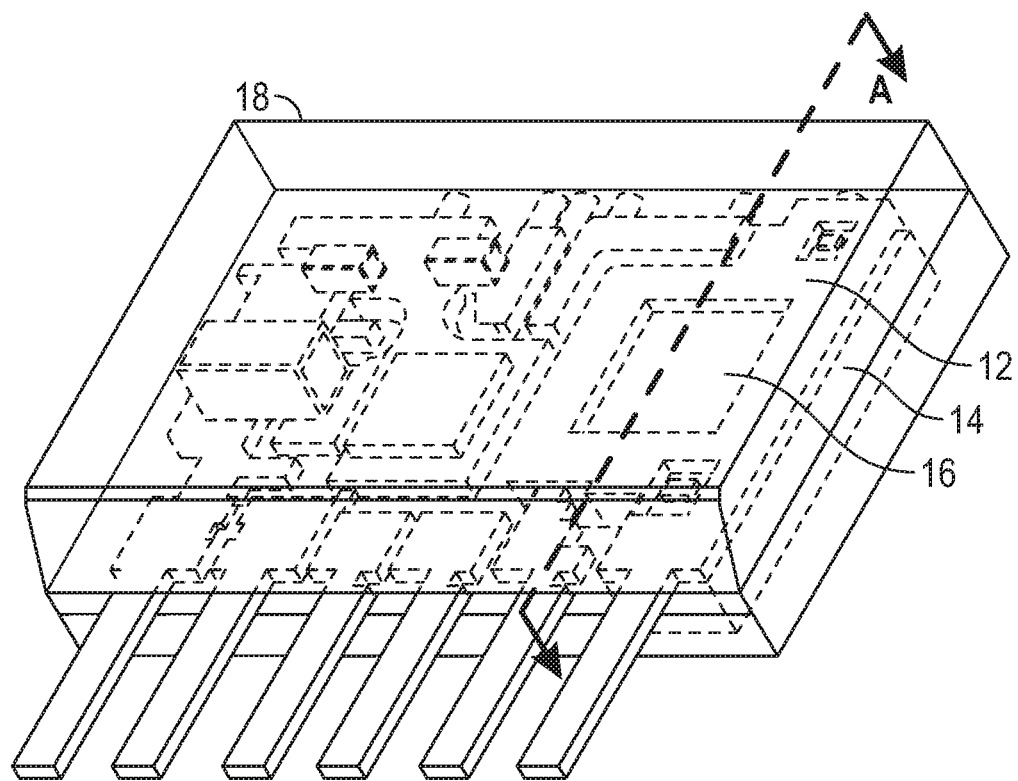
FIG. 2 illustrates a perspective see-through view of an implementation of a semiconductor package.

Referring to FIG. 2, a perspective see-through view of an implementation of a semiconductor package is illustrated. A cross section taken at line A, as illustrated in FIG. 2 yields the view of a semiconductor package as illustrated in FIG. 1. Referring again to FIG. 2, a leadframe 12 is stacked on top of, or coupled over, a die pad 14. An opening, or solder dam 16 is formed by the leadframe 12 and the die pad 14. As illustrated, the leadframe 12 also include other openings and structures used to accommodate the various active and passive components used in the rest of the package as well as to form the structure of the package pins. In various implementations, by non-limiting example, the solder dam 16 could be formed at least partially using from other components of the semiconductor package where electrical bridging through common contact of the die with the solder and the component is not an issue. In various implementations, by non-limiting example, the solder dam 16 could be of any shape, size, depth, or volume designed to correspond with the pad size and the die size. In various implementations, the solder dam 16 has a perimeter that corresponds with a semiconductor die that may be placed in the solder dam 16 over the die pad 14. As illustrated, and in various implementations, by non-limiting example, the perimeter of the solder dam 16 is a predetermined or predefined distance greater than the perimeter of a semiconductor die placed within the solder dam 16.

Figure 3:
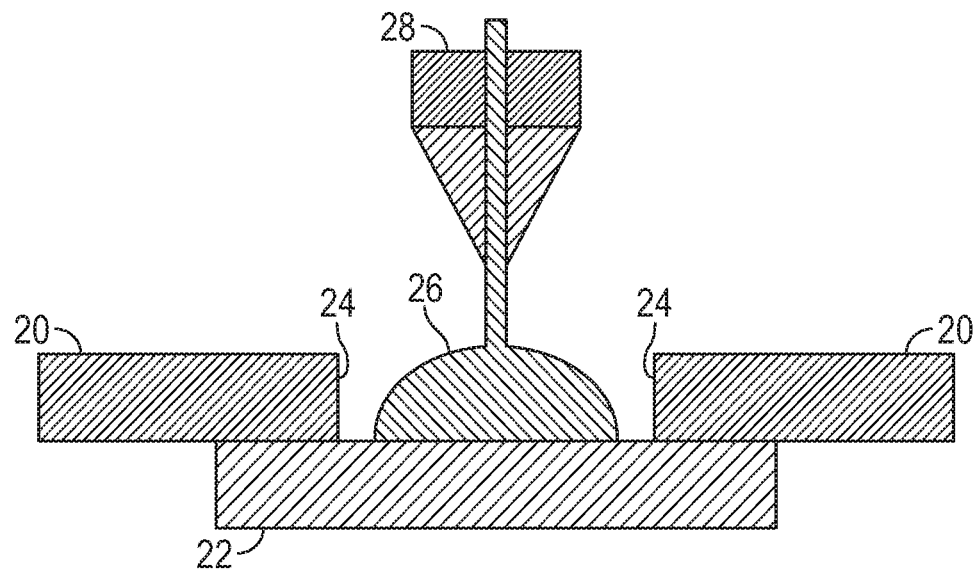
FIG. 3 illustrates a dispense of solder.

Referring to FIG. 3, a dispense of solder is illustrated into solder dam 24. As illustrated, a leadframe 20 is stacked, or coupled over, a die pad 22. As illustrated, the leadframe 20 forms, or has, a solder dam 24. As illustrated, solder 26 is dispensed or deposited by way of a depositing system 28 into the solder dam 24, and is be retained therein. In various implementations, by non-limiting example, the retaining of the solder 26 within the solder dam 24 may prevent tilt of a semiconductor die that may be bonded or placed within the solder dam 24. In various implementations, by non-limiting example, no spanker is used in the depositing of the solder 26.

Figure 4:
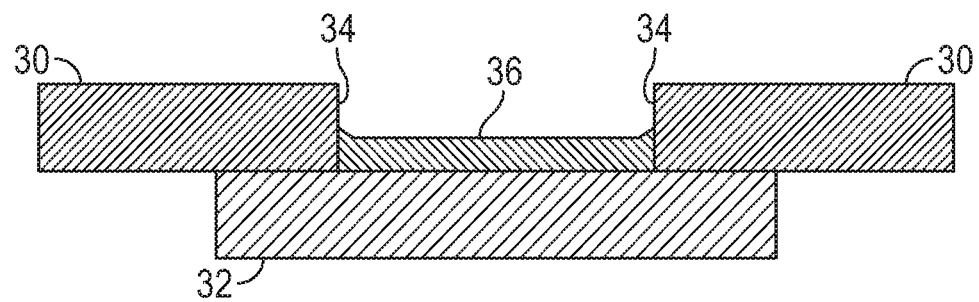
FIG. 4 illustrates an implementation of a leadframe stacked on an implementation of a die pad after solder dispense.

FIG. 4 illustrates why no spanker is needed where a solder dam 34 is used. As illustrated, solder 36 is shown spreading out across the material of the pad 32 under surface tension forces. Because in various implementations the solder is designed to have a surface energy that has an affinity for contact with other metal surfaces, the solder may flow up the sides of the solder dam 34 a certain distance under surface tension force as illustrated in FIG. 4. The resulting surface tension forces and flow of the solder up the sides of the solder dam 34 will tend to flatten the upper surface of the solder which will ultimately receive the die. As a result, the die will be placed over a substantially uniformly thick layer of solder immediately under the die. This may, in various implementations, assist with improving heat transfer from the die to the pad 32 and leadframe 30 as the thermal resistance of the materials under the die will be substantially uniform corresponding with the substantially uniformly thick layer of solder. This retaining of the solder 36 within the solder dam 34 may correspondingly prevent tilt of a semiconductor die that may be bonded or placed within the solder dam 34.

Figure 5:
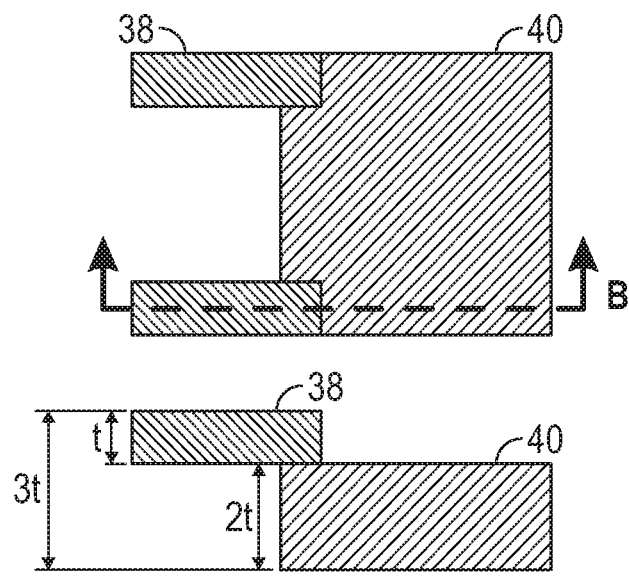
FIG. 5 illustrates an implementation of a leadframe stacked above a second heatsink implementation.

Referring to FIG. 5, an implementation of a leadframe stacked above a second heatsink implementation is illustrated. As illustrated, a leadframe 38 is stacked above, or coupled over, a second heatsink 40. When a cross section along sectional line B of FIG. 5 is taken, as illustrated, the cross section in the lower portion of FIG. 5 results. As illustrated, the thickness of the leadframe 38 can be represented as t. As illustrated, the thickness of the second heatsink 40 can be represented as 2t. As illustrated, the combined thickness of the stacked, or coupled, leadframe 38 and second heatsink 40 is therefore 3t.

Figure 6:
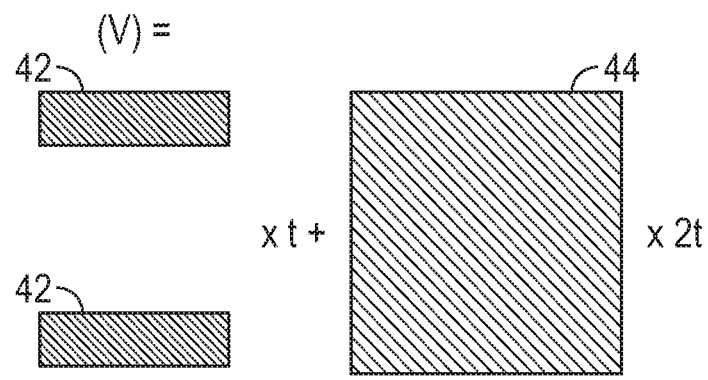
FIG. 6 illustrates an implementation of a method of providing a heatsink for a semiconductor package through bonding a second heatsink with the leadframe.

Referring to FIG. 6, a heatsink like that illustrated in FIG. 5 is illustrated. The leadframe 42 represents a first portion of the total volume of the heatsink. As illustrated, a second heatsink 44 represents a second portion of the total volume of a heatsink. In various implementations, when the leadframe 42 is stacked above, or coupled over, the second heatsink 44, the total volume of the resulting heatsink is the (area of leadframe 42*t+the area of second heatsink 44)*2t.

Figure 7:
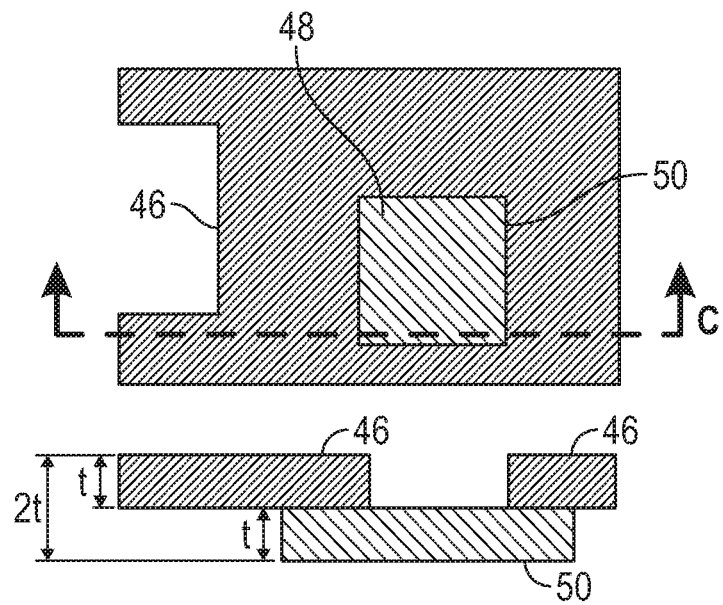
FIG. 7 illustrates an implementation of a leadframe stacked above a first heatsink implementation.

Referring to FIG. 7, an implementation of a leadframe stacked above a first heatsink implementation is illustrated. As illustrated, a leadframe 46 includes a solder dam opening 48 through the leadframe 46. As illustrated, the first heatsink 50 is bonded with the leadframe 46. In various implementations, by non-limiting example, the leadframe 46 may have a thickness, and the first heatsink 50 may have another thickness. Each of both of these thicknesses may be the same, or they may be different. When cross section C is taken, as illustrated, the thickness of the leadframe 46 may be represented as t, and the thickness of the first heatsink 50 may be represented as t as in this implementation, the thickness of the leadframe and the thickness of the heatsink are set to be the same. Thus, in total, the thickness of the leadframe 46 coupled with the thickness of the first heatsink 50 is 2t. In various implementations, by non-limiting example, a combined thickness of the leadframe 46 and the first heatsink 50 is therefore two-thirds of a combined thickness of the leadframe 38 without a solder dam opening and the first heatsink 50 (as shown in FIG. 5).

Figure 8:
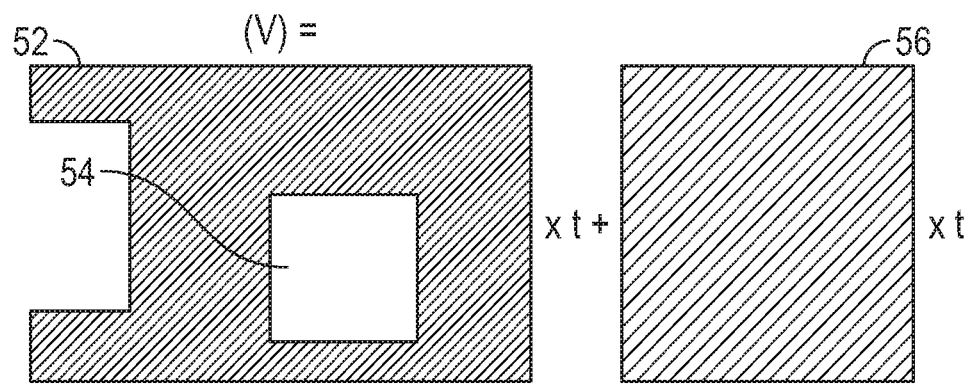
FIG. 8 illustrates a method of providing a heatsink for a semiconductor package through bonding a first heatsink with the leadframe.

Referring to FIG. 8, a heatsink implementation similar to that in FIG. 7 for a semiconductor package is illustrated. As illustrated, the area of leadframe 52, with a solder dam opening 54, represents a portion of the total volume of a heatsink. As illustrated, the area of the first heatsink 56 also represents a portion of the total volume of a heatsink. In various implementations, when the leadframe 52 is stacked above, or coupled over, the first heatsink 56, the total volume is the (area of leadframe 52+area of heatsink 50)*t. By inspection it is clear that the use of the solder dam design results in a leadframe with more area than the leadframes 38, 42 in FIGS. 5 and 6. Because of this, the thickness of the heatsink 50 can be reduced in various implementations to be the same as the thickness of the leadframe, resulting in a 2/3 reduction in thickness of the total leadframe+heatsink thickness but maintaining the same volume usable to dissipate heat from the die. In some implementations, because of the increase in area, the total volume of the leadframe+heatsink thickness may be able to be reduced when compared to leadframe designs like those illustrated in FIGS. 5 and 6. In some implementations, the thickness of the heatsink may be thinner than the thickness of the leadframe. In various implementations, by non-limiting example, a volume of the leadframe 52 and the first heatsink 56 may be the same, or substantially the same, as a volume of a leadframe 42 without a solder dam opening 54 and a second heatsink 44 (as shown in FIG. 6).

Various implementations of semiconductor packages like those illustrated here may be formed using implementations of a method of providing a heatsink for a semiconductor package. As illustrated using the structures in FIGS. 5-8, the method includes providing a leadframe 46, 54 that has a solder dam opening 48, 54 therethrough where the leadframe as a first thickness t. The method then includes bonding a first heatsink 50, 56 with the leadframe where the thickness of the first heatsink is the same or substantially the same as the thickness t. The method then includes constructing an area of the leadframe such that the resulting volume of the area of the (leadframe+the area of the first heatsink)*t is the same as the volume of a leadframe without a solder dam opening therethrough 38, 42 in combination with a second heatsink. In some implementations, the method may include constructing an area of the leadframe or adjusting the thickness of the leadframe and/or first heatsink such that the volume of the leadframe is smaller than the volume of the leadframe without a solder dam opening in combination with the second heatsink. In various implementations, the method may include reducing the total thickness of a package through using the solder dam to reduce the thickness of the first heatsink relative to a thickness of the second heatsink.

While the discussion in FIGS. 5-8 has use the word "heatsink" to refer to the structure over which the leadframe is bonded, it must be understood that this structure would also include the material of any pad that the solder dam opening is coupled over as well and the pad would be included in the total volume calculation as well.

Figure 9:
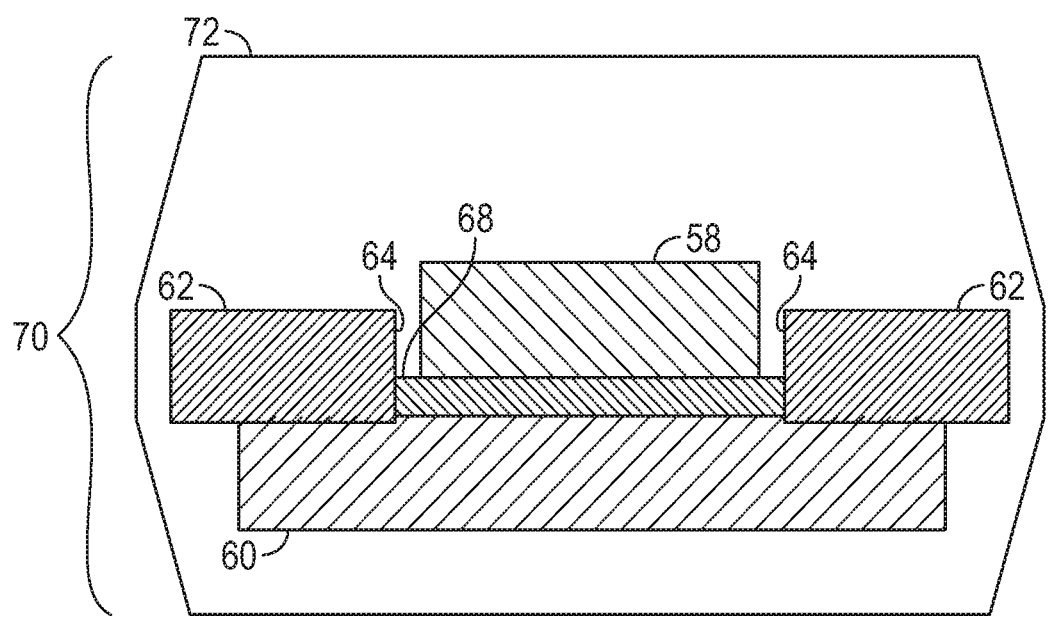
FIG. 9 illustrates an encapsulated semiconductor package without grooves in a die pad.

Referring to FIG. 9, a cross section of an encapsulated semiconductor package with a solder dam without grooves in the pad is illustrated. As illustrated, a semiconductor die 58 is coupled to a die pad 60. In various implementations, by non-limiting example, the die pad 60 may be plated with any metal disclosed herein. In various implementations, the semiconductor die 58 has a perimeter. As illustrated, a leadframe 62 is stacked on top of, or coupled over, the die pad 60 and the semiconductor die 58. As illustrated, the leadframe 62 forms, or has, a solder dam 64 that surrounds, or couples around the semiconductor die 58. In various implementations, the solder dam 64 has a perimeter that corresponds with the semiconductor die 58 which contains solder 68 within the perimeter. As illustrated, the die pad 60 includes no groove adjacent to the semiconductor die 58 in the material of the pad. As illustrated, the semiconductor package 70, or the semiconductor die 58, die pad 60, and leadframe 62, may be encapsulated in an encapsulant 72. In various implementations, by non-limiting example, the encapsulant may be any encapsulating material disclosed herein.

In various implementations, by non-limiting example, the leadframes described above may be manufactured by etching, stamping, any combination thereof, or by another metal forming process, and may be made from a metal or metal alloy, such as, by non-limiting example, a copper or an iron-nickel alloy. In various implementations, by non-limiting example, the semiconductor die as described above may be, by non-limiting example, formed of a silicon substrate, a single crystal silicon substrate, a ruby substrate, a sapphire substrate, a silicon carbide substrate, a silicon on insulator substrate, a gallium arsenide substrate or any other semiconductor substrate type In various implementations, by non-limiting example, the encapsulant described above may be resin, metal, plastic, glass, ceramic, or any other material that may be used to encapsulate or encase the leadframe and die.

In places where the description above refers to particular implementations of leadframe systems and related methods and implementing components, sub-components, methods and sub-methods, it should be readily apparent that a number of modifications may be made without departing from the spirit thereof and that these implementations, implementing components, sub-components, methods and sub-methods may be applied to other leadframe systems and related methods.

What is claimed is:

1. A semiconductor package comprising:
   a die pad;
   a semiconductor die coupled to the die pad, the semiconductor die having a perimeter; and
   a leadframe coupled over the die pad and the semiconductor die, the leadframe comprising a solder dam coupled around the semiconductor die, the solder dam comprising an opening having a perimeter greater than the perimeter of the semiconductor die.

2. The semiconductor package of claim 1, further comprising solder, wherein the solder is configured to be deposited within the solder dam without a spanker.

3. The semiconductor package of claim 2, wherein the solder is flux-contained.

4. The semiconductor package of claim 1, wherein the die pad is plated with a metal.

5. The semiconductor package of claim 1, wherein the die pad, the semiconductor die, and the leadframe are encapsulated in an encapsulant.

6. A method of making a semiconductor package comprising:
   providing a die pad;
   coupling a leadframe over the die pad, the die pad separate from the leadframe and the leadframe comprising a solder dam having a first perimeter;
   depositing solder into the solder dam;
   bonding a semiconductor die to the solder within the first perimeter; and
   retaining the solder under the semiconductor die using the solder dam.

7. The method of claim 6, wherein the die pad comprises no groove adjacent to the semiconductor die.

8. The method of claim 6, further comprising preventing tilt of the semiconductor die through retaining the solder using the solder dam.

9. The method of claim 6, wherein the first perimeter is greater than a second perimeter of the semiconductor die.

10. The method of claim 6, wherein the solder dam comprises an opening within the leadframe, the opening having the first perimeter greater than a second perimeter of the semiconductor die.

11. The method of claim 6, further comprising encapsulating the die pad, the semiconductor die, and the leadframe in an encapsulant.

12. The method of claim 6, further comprising plating the die pad with a metal.

13. The method of claim 6, wherein coupling the leadframe over the die pad further comprises passing the die pad through an opening in the leadframe, the opening comprising a solder dam opening.

14. A method of providing a heatsink for a semiconductor package, the method comprising:
    providing a leadframe having a solder dam opening therethrough, the leadframe having a first thickness; and
    bonding a first heatsink with the leadframe, the first heatsink having a second thickness that is the same as the first thickness;
    wherein a volume of the leadframe and the first heatsink is the same as a volume of a leadframe without a solder dam opening therethrough and a second heatsink.

15. The method of claim 14, wherein the solder dam opening has a perimeter a predetermined distance greater than a perimeter of a semiconductor die, wherein the solder dam opening prevents a flow of solder.

16. The method of claim 14, wherein no spanker is used after depositing solder into the solder dam opening.

17. The method of claim 14, wherein a combined thickness of the leadframe and the first heatsink is two-thirds of a combined thickness of the leadframe without the solder dam opening and the first heatsink.

18. The method of claim 14, further comprising bonding a semiconductor die to solder within a perimeter of the solder dam opening.

19. The method of claim 18, further comprising encapsulating at least the leadframe in an encapsulant.

20. The method of claim 18, further comprising preventing tilt of a semiconductor die through retaining the solder with the solder dam opening.

* * * * *